(12) United States Patent
Otremba et al.

(10) Patent No.: US 9,899,481 B2
(45) Date of Patent: Feb. 20, 2018

(54) ELECTRONIC COMPONENT AND SWITCH CIRCUIT

(71) Applicant: Infineon Technologies Austria AG, Villach (AT)

(72) Inventors: Ralf Otremba, Kaufbeuren (DE); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/997,914

(22) Filed: Jan. 18, 2016

(65) Prior Publication Data
US 2017/0207306 A1 Jul. 20, 2017

(51) Int. Cl.
*H03K 17/687* (2006.01)
*H01L 29/20* (2006.01)
*H01L 29/78* (2006.01)
*H01L 29/16* (2006.01)

(52) U.S. Cl.
CPC ...... *H01L 29/2003* (2013.01); *H01L 29/1608* (2013.01); *H01L 29/7801* (2013.01); *H03K 17/687* (2013.01)

(58) Field of Classification Search
CPC .................................................. H01L 29/2003
USPC ....................................................... 327/434
See application file for complete search history.

(56) References Cited

U.S. PATENT DOCUMENTS

| 7,250,641 | B2 | 7/2007 | Saito et al. |
| 7,838,097 | B2 | 11/2010 | Hayashida et al. |
| 2006/0033122 | A1* | 2/2006 | Pavier ............... H01L 23/49562 257/177 |
| 2009/0212284 | A1* | 8/2009 | Otremba ............. H01L 23/4952 257/48 |
| 2011/0049580 | A1* | 3/2011 | Lui ................... H01L 23/49575 257/262 |
| 2011/0101466 | A1 | 5/2011 | Wu |
| 2012/0022332 | A1 | 1/2012 | De Domenico |
| 2012/0223322 | A1 | 9/2012 | Lin et al. |
| 2014/0252577 | A1 | 9/2014 | Otremba et al. |
| 2015/0115313 | A1* | 4/2015 | Otremba .......... H01L 23/49503 257/124 |
| 2015/0116025 | A1 | 4/2015 | Otremba et al. |

FOREIGN PATENT DOCUMENTS

DE 102014102910 A1 9/2014

* cited by examiner

*Primary Examiner* — Lincoln Donovan
*Assistant Examiner* — Metasebia Retebo
(74) *Attorney, Agent, or Firm* — Murphy, Bilak & Homiller, PLLC

(57) ABSTRACT

In an embodiment, an electronic component includes a compound semiconductor transistor device having a first current electrode, a second current electrode and a control electrode, a die pad, a first lead, a second lead and a third lead. The first lead, the second lead and the third lead are spaced at a distance from the die pad. The control electrode is coupled to the first lead, the first current electrode is coupled to the die pad and the second current electrode is coupled to the second lead. The third lead is coupled to the compound semiconductor transistor device and provides a source sensing functionality.

17 Claims, 8 Drawing Sheets

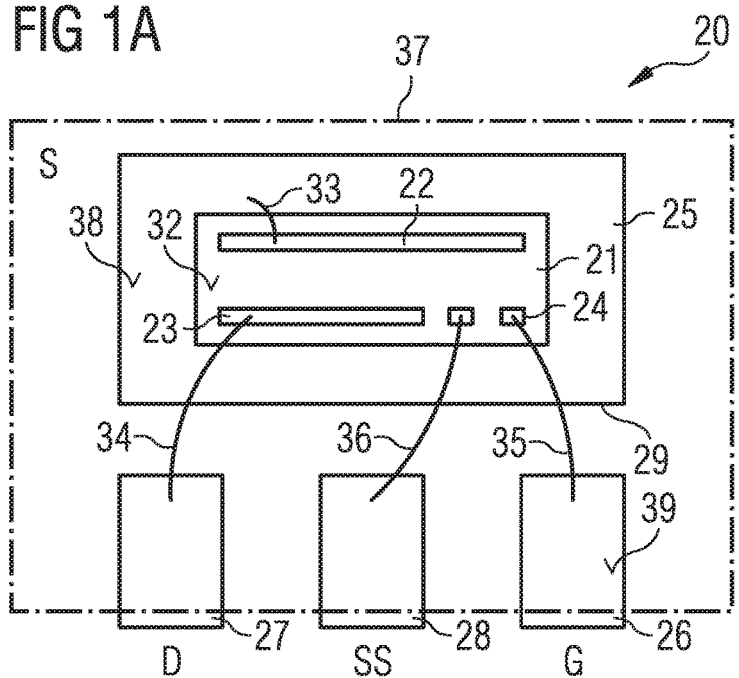
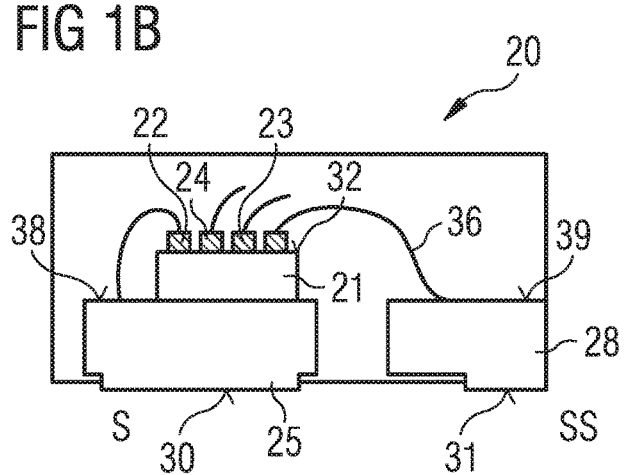
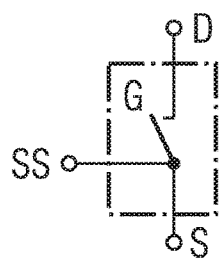

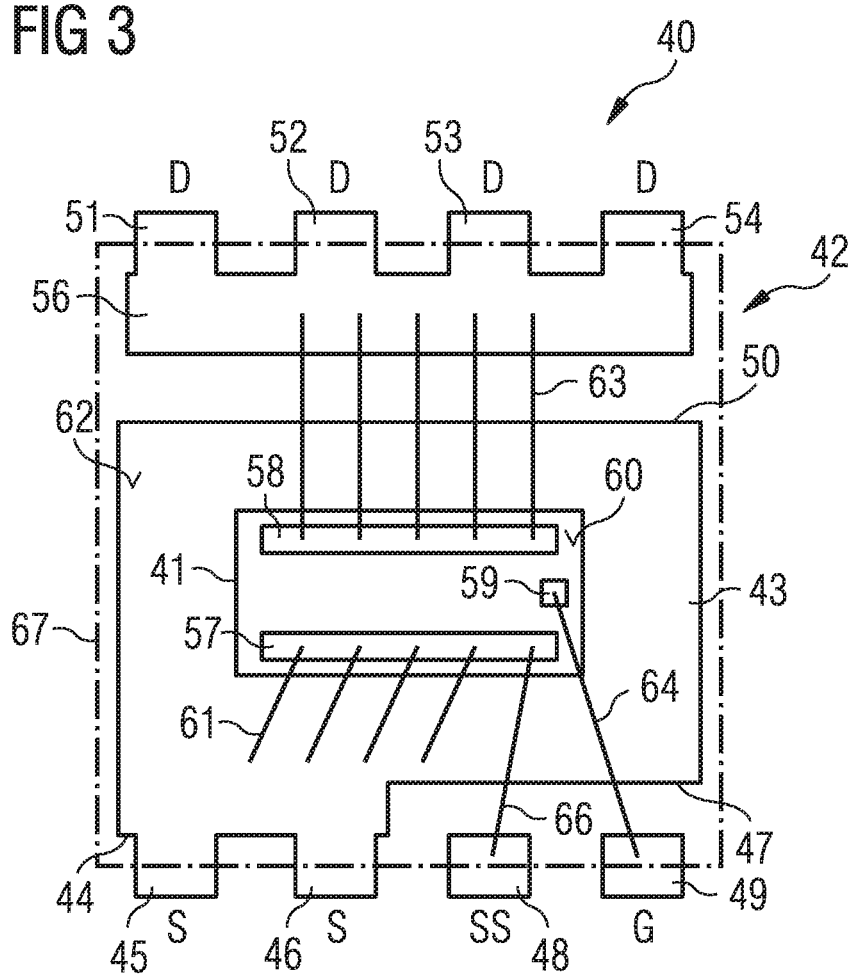
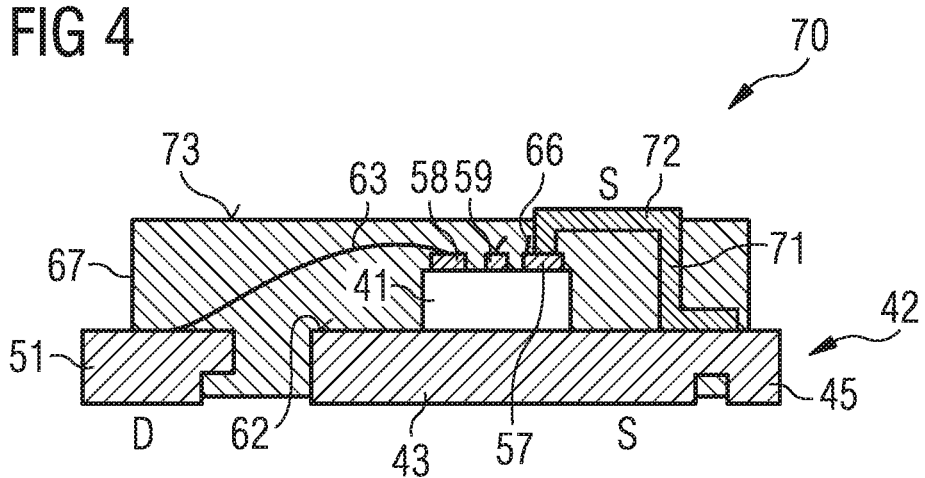

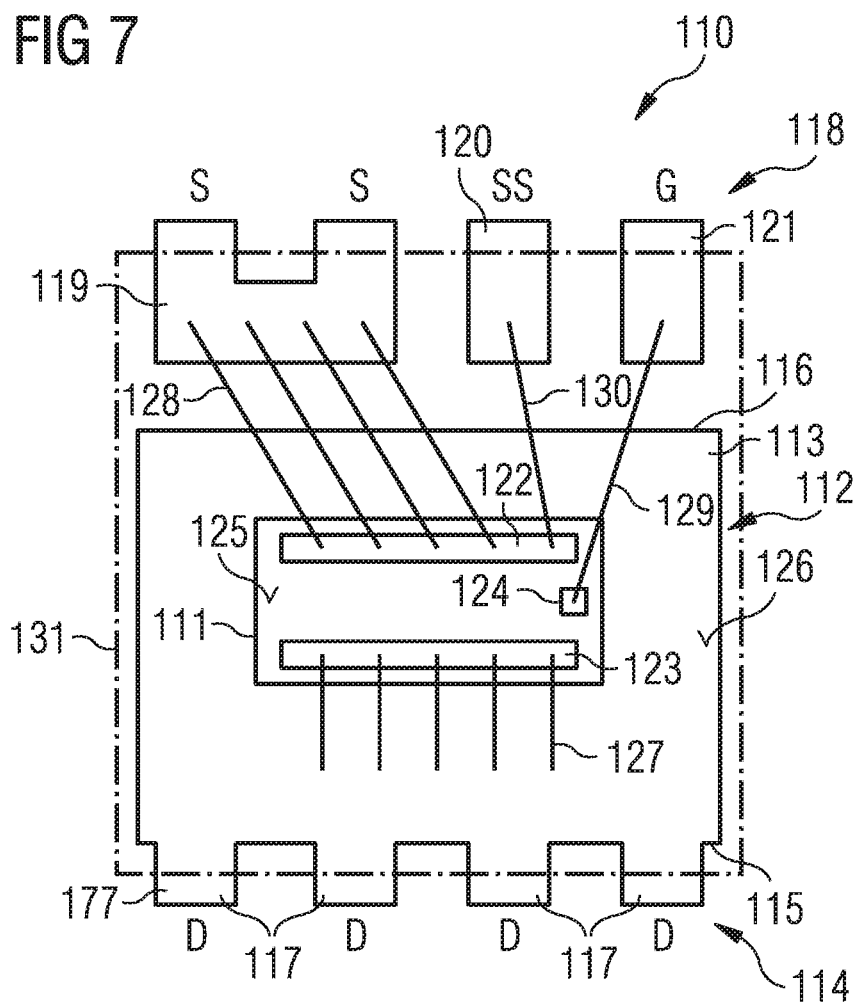

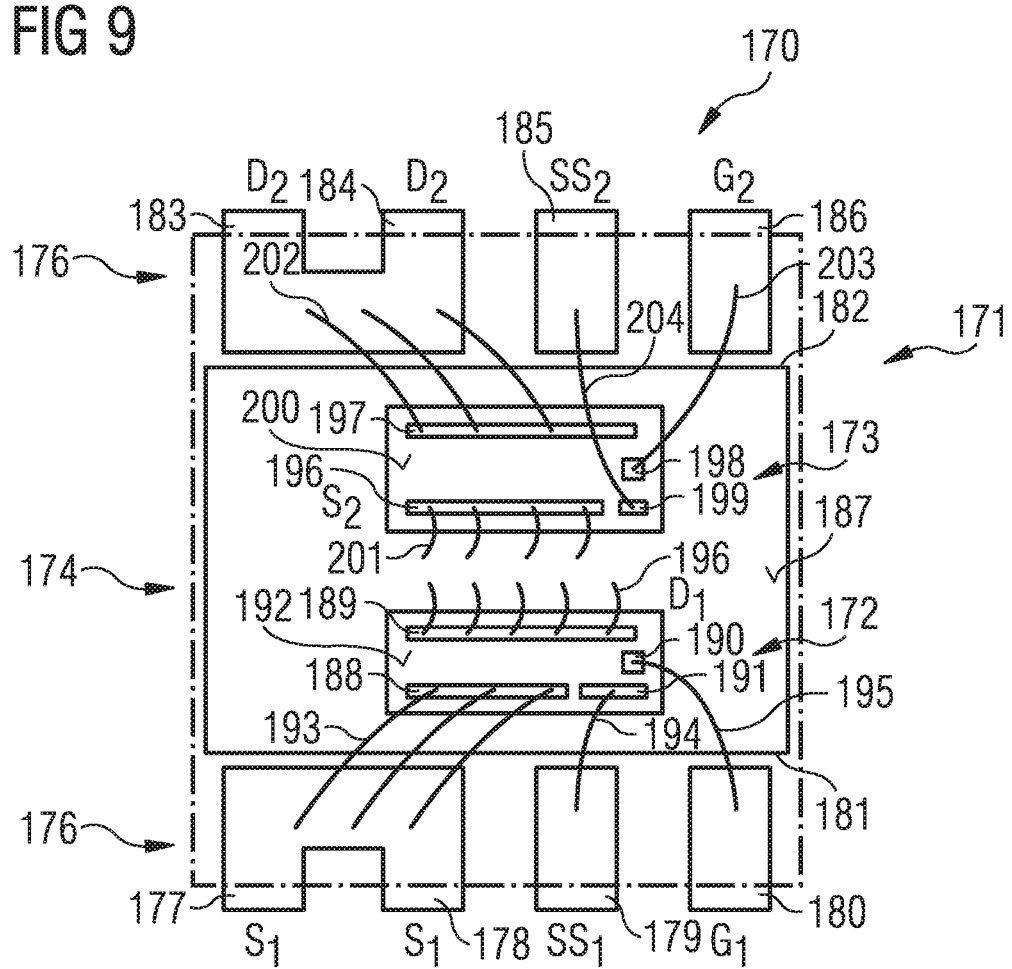

ELECTRONIC COMPONENT AND SWITCH CIRCUIT

BACKGROUND

An electronic component may include one or more semiconductor devices in a package. The package includes internal electrical connections from the semiconductor device to a substrate or a leadframe which includes outer contacts. The outer contacts are used to mount the electronic component on a redistribution board, such as a printed circuit board. The package may include a housing which covers the semiconductor device and the internal electrical connections. The housing may include a plastic material, such as epoxy resin, and may be formed by a mold process, such as injection molding.

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, compound semiconductor devices such as silicon carbide (SiC) power devices and Group III-N semiconductor devices, such as gallium nitride (GaN) devices, have been considered. These devices are now emerging as attractive candidates to carry large currents, support high voltages and to provide very low on-resistance and fast switching times. The high voltages and fast switching times of such devices result in additional challenges for package development.

SUMMARY

In an embodiment, an electronic component includes a compound semiconductor transistor device having a first current electrode, a second current electrode and a control electrode, a die pad, a first lead, a second lead and a third lead. The first lead, the second lead and the third lead are spaced at a distance from the die pad. The control electrode is coupled to the first lead, the first current electrode is coupled to the die pad and the second current electrode is coupled to the second lead. The third lead is coupled to the compound semiconductor transistor device and provides a source sensing functionality.

In an embodiment, a switch circuit includes a first transistor device and a second transistor device. The first transistor device includes a compound semiconductor, a first current electrode, a second current electrode and a control electrode, a die pad, a first lead, a second lead, and a third lead, the first lead. The second lead and the third lead are spaced at a distance from the die pad. The control electrode is coupled to the first lead, the first current electrode is coupled to the die pad and the second current electrode is coupled to the second lead. The third lead is coupled to the transistor device and provides a source sensing functionality. The first transistor device has a current path coupled serially or antiserially with a current path of the second transistor device.

In an embodiment, an electronic component includes a Group III nitride-based transistor device having a blocking voltage capability of at least 400V and a switching frequency capability of at least 100 kHz and a housing. The Group III nitride-based transistor device includes a first current electrode, a second current electrode and a control electrode. The control electrode is coupled to a first lead, the first current electrode is coupled to a die pad, the second current electrode is coupled to a second lead and a third lead is coupled to the Group III nitride-based transistor device and provides a source sensing functionality. The first lead, the second lead and the third lead are spaced at a distance from the die pad and lower surfaces of the die pad, of the first lead, of the second lead and of the third lead are exposed from the housing and provide substantially planar contact surfaces.

In an embodiment, an electronic component includes means for coupling a control electrode of a compound semiconductor transistor device to a first lead, means for coupling a first current electrode of the compound semiconductor transistor device to a die pad, means for coupling a second current electrode of the compound semiconductor transistor device to a second lead and means for providing source sensing at a third lead.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1a illustrates a plan view of an electronic component according to a first embodiment.

FIG. 1b illustrates a cross-sectional view of the electronic component according to the first embodiment.

FIG. 2 illustrates a circuit diagram of a transistor with source sense functionality.

FIG. 3 illustrates a plan view of an electronic component according to a second embodiment.

FIG. 4 illustrates a cross-sectional view of an electronic component according to a third embodiment.

FIG. 7 illustrates a plan view of an electronic component according to a fifth embodiment.

FIG. 9 illustrates a plan view of an electronic component including a switch circuit with two compound semiconductor transistor devices and a source sensing functionality.

DETAILED DESCRIPTION

Figure 5:
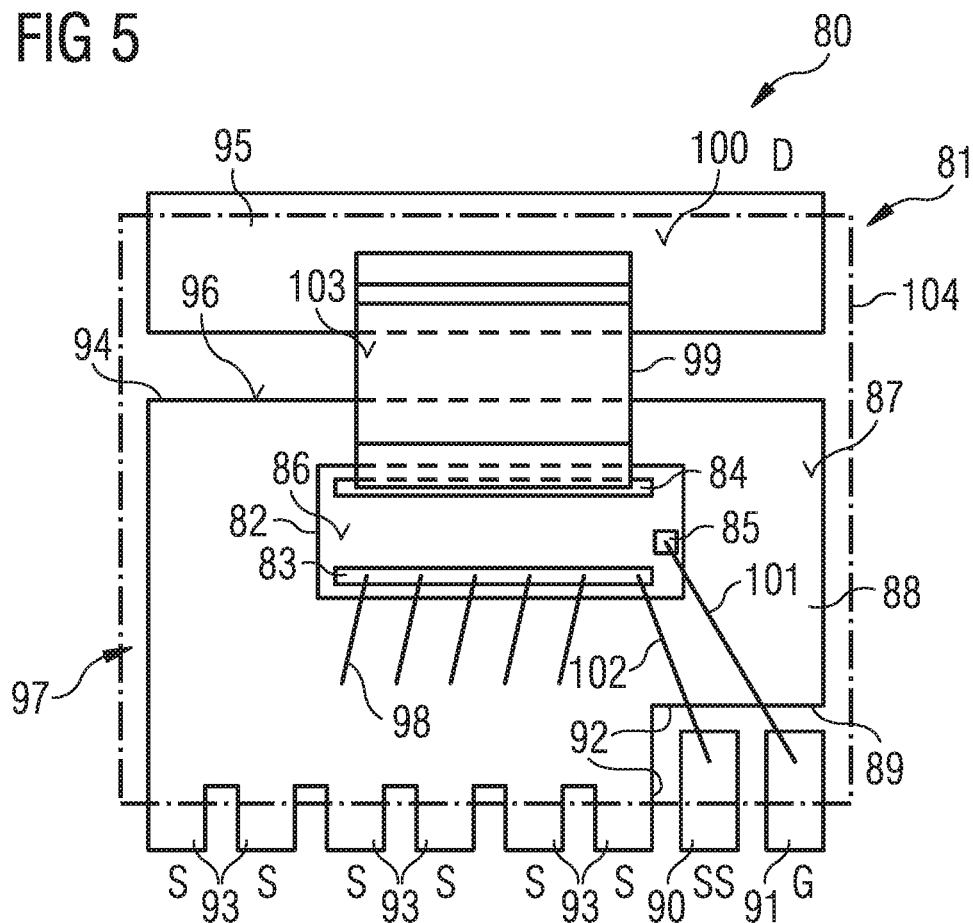
FIG. 5 illustrates a plan view of an electronic component according to a fourth embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, a "high-voltage device", such as a high-voltage depletion-mode transistor, is an electronic device which is optimized for high-voltage switching applications. That is, when the transistor is off, it is capable of blocking a high voltage of 400 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 400 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Aluminum gallium nitride and AlGaN refers to an alloy described by the formula $Al_xGa_{(1-x)}N$, where 0<x<1.

FIG. 1a illustrates a plan view and FIG. 1b a cross-sectional view of an electronic component 20 according to a first embodiment. FIG. 2 illustrates a circuit diagram of the electronic component 20.

The electronic component 20 includes a compound semiconductor transistor device 21 which includes a first current electrode 22, a second current electrode 23 and a control electrode 24. The electronic component 20 further includes a die pad 25, a first lead 26, a second lead 27 and a third lead 28. The first lead 26, the second lead 27 and the third lead 28 are spaced apart from the die pad 25. In the electronic component 20 according to the first embodiment, the first lead, 26, the second lead 27, and the third lead 28 are arranged adjacent and spaced apart from a single side face 29 of the die pad 25. However, the arrangement of the leads with respect to the die pad may differ. For example, more than three leads may be provided and one or more of the leads may be arranged on adjacent two or more side faces of die pad 25.

As can be seen in the cross-sectional view of FIG. 1b, the die pad 25 has lower surface 30 which is substantially coplanar with the lower surfaces 31 of the leads 26, 27, 28. These lower surfaces 30, 31 provide the outer contact surfaces of the electronic component 20 and are surface mountable so that the electronic component 20 is a surface mountable device (SMD). The upper surface 38 of the die pad 25 and the upper surfaces 39 of the leads 26, 27, 28 are substantially coplanar. The die pad 25, first lead 25, second lead 27 and third lead 39 may include a metal such as copper.

The compound semiconductor transistor device 21 is a lateral device which has a lateral drift path. A first current electrode 22, second current electrode 23 and the control electrode 24 are arranged on an upper surface 32 of the compound semiconductor transistor device 21.

The control electrode 24 is coupled to the first lead 26, the first current electrode 22 is coupled to the die pad 25, the second current electrode 23 is coupled to the second lead 27 and the third lead 28 is coupled to the compound semiconductor transistor device 21 and provides a source sense functionality.

In the embodiment illustrated in FIGS. 1a and 1b, the first current electrode 22 is the source electrode of the compound semiconductor device 21 and is electrically coupled to the die pad 25 by a conductive connector 33. The conductive connector 33 may the provided by one or more bond wires or a contact clip. In this embodiment, the die pad 25 is coupled to source so that the lower surface 30 of the die pad 25 provides a source contact for the electronic component 20. The second current electrode 23 is the drain electrode of the compound semiconductor transistor device 21 which is coupled to the second lead 27 by a conductive connector 34 which may include one or more bond wires or a contact clip. The control electrode 24 is a gate electrode which is coupled to the first lead 26 by a conductive connector 35 such as a bond wire.

In order to provide a source sensing functionality for the electronic component 20, a further electrical connection is made between the third lead 28 and source of the compound semiconductor transistor device 21, for example by a bond wire 36, electrically coupling the third lead 28 to source of compound semiconductor transistor device 21. The first lead 26 coupled to the gate electrode and the third lead 28 providing a source since functionality may be arranged adjacent one another and may be arranged on the same or on the opposing side of the die pad 25 to the lead 27 coupled to the drain electrode.

The electronic component 20 may include a housing 37 which encapsulates the side faces and upper surfaces of the die pad 25, the leads 26, 27, 28 and the electrical connections 33, 34, 35, 36 between the transistor device 21 and the upper surface 38 of the die pad 25 and upper surface 39 of the leads 26, 27, 28. The housing 37 may include an epoxy resin, for example. The lower surfaces 30, 31 of the die pad 25 and leads 26, 27, 28 are exposed from the housing 37 and provide contact areas or contact pads for providing an electrical connection to the compound semiconductor transistor device 21 within the housing 37. In some embodiments, a portion of the leads 26, 27, 28 and die pad 25 may be exposed in the side faces of the housing 37. The electronic component 20 provides a compound semiconductor transistor device 21 in a package suitable for use in surface mount technology (SMT).

The compound semiconductor transistor device 21 may include a blocking voltage capability of at least 400 V and, in some embodiments, at least 650 V, and switching frequency capability of at least 100 kHz.

The compound semiconductor device 21 may be an enhancement-mode device. An enhancement mode device has a positive threshold voltage which means that it cannot conduct current at zero gate voltage and is normally off.

In the drawings the leads providing the nodes of the circuit are designated with source (S), drain (D), gate (G) and source sense (SS).

FIG. 2 illustrates a circuit diagram of the circuit which is provided by the electronic component 20. The circuit includes four nodes; source (S), drain (D), gate (G) and source sense (SS). The source sense node (SS) is coupled directly to the source (S) of the transistor.

In some gate driving arrangements, high switching speeds of a transistor device can result in a voltage drop across a parasitic source inductance which is sufficiently high to counteract the driving voltage which may result in increased energy loss. The parasitic source inductance is excluded from the driver circuitry by the use of the separate connection to the source provided.

The additional electrical connection between the source 22 of the transistor device 21 and the lead 28, which is separate from the connection between the source pad 22 and the die pad 25, provides the compound semiconductor device 21 and electronic component 20 with a source sense functionality which may be used as a reference voltage by gate driver circuitry to exclude the parasitic source inductance from the driver circuit.

In some embodiments, such as that illustrated in FIG. 1, the compound semiconductor transistor device 21 is a lateral device which has a lateral drift path. In a lateral device, the first current electrode 22, the second current electrode 23 and the control electrode 24 are arranged on the upper surface 32 of the compound semiconductor transistor device 21. The compound semiconductor transistor device 21 may include a compound semiconductor such as a Group III nitride-based transistor device which may be a High Electron Mobility Transistor (HEMT).

In some embodiments, the compound semiconductor device 21 may a vertical device having a vertical drift path, in which case one of the current electrodes is arranged on lower surface of the body of the compound semiconductor transistor device and the other current electrode and control electrode are arranged on the opposing surface of the compound semiconductor transistor device. An example of a compound semiconductor transistor device having a vertical drift path is silicon carbide-based compound semiconductor transistor device.

In embodiments in which the compound semiconductor transistor device 21 includes a vertical device, a first current electrode and the control electrode are arranged on a first surface and the second current electrode is arranged on the opposing surface. In these embodiments, the second current electrode, typically the drain, is coupled to the die pad by mounting the second current electrode onto the die pad.

If the compound semiconductor transistor device 21 is a lateral device, either one of the two current electrodes, for a HEMT source or drain, is electrically coupled to the die pad 25 by an additional connector extending between current electrode on the upper surface of the transistor device and the die pad 25.

In embodiments, in which the first current electrode, such as the source, is coupled to the die pad, the second current electrode, such as the drain, is electrically coupled to at least one lead arranged adjacent and spaced apart from the die pad. However, in other embodiments, the second current electrode, such as drain, is electrically coupled to the die pad by a connector such as one or more bond wires or a contact clip and the source is electrically coupled to a lead which is arranged adjacent and spaced apart from the die pad.

The electronic component may conform to a JEDEC package outline and, in some embodiments, conforms to a TO leadless (TOLL) package outline or ThinPak 8×8 package outline. Thus, a compound semiconductor transistor device may be accommodated within a standard package and include a source sense functionality. Furthermore, a lateral transistor device, such as a gallium nitride-based HEMT may be provided with a JEDEC package outline, in particular a TO leadless (TOLL) package outline or a ThinPak 8×8 package outline with a source sense functionality. Consequently, a lateral transistor device may be used in place of a vertical transistor device such as a CoolMOS® silicon-based transistor device as both types of device can be provided with the same package outline.

The selection of the current electrode which is electrically coupled to the die pad may be carried out depending on the position of the electronic component in an application such as a switch circuit. For example, if the electronic component is to provide the low side switch of a half bridge circuit, the drain electrode may be coupled to the die pad, whereas if the electronic component is to provide the high side switch of a half bridge circuit, the source electrode may be coupled to the die pad. This combination enables the two die pads to be mounted on, and electrically coupled to, a common conductive trace and form the output node of the half bridge circuit.

In some embodiments, a half-bridge circuit may be provided by a single electronic component including two transistor devices and a source sense functionality by mounting both transistor devices on a single die pad and coupling the drain of the transistor device providing low side switch and the source of the transistor device providing the high side switch to the die pad.

In embodiments in which a contact clip is used to coupled one of the current electrodes is coupled to the die pad or a lead, the entire contact clip may be encapsulated by the housing or a portion, such as the upper surface, may be exposed from the encapsulation material and form a portion of the upper surface of the electronic component. The exposed region of the contacts clip may be used as cooling surface on to which an additional heat dissipation device such as a heat sink may be mounted. This exposed region of the contact clip may be used to provide top side cooling for the electronic component.

The electronic component according to one any one of these embodiments may be used as part of a switch circuit including two transistor devices. Each transistor device has a current path and the current path of the first transistor device may be coupled serially or antiserially with the current path of the second transistor device.

For example, if the switch circuit is a half bridge circuit or a cascode, the current path of the first transistor device is coupled in series with the current path of the second transistor device. If both transistor devices include a High Electron Mobility Transistor (HEMT), the drain of the first transistor device is coupled with source of the second transistor device so that the current paths are coupled serially.

If the switch circuit is a bidirectional switch, the current path of the first transistor device is coupled antiserially with the current path of the second transistor device. If both transistor devices include a High Electron Mobility Transistor (HEMT), the source of the first transistor device is coupled to source of the second transistor device so that the current paths are coupled antiserially.

FIG. 3 illustrates a plan view of an electronic component 40 according to a second embodiment. The electronic component 40 includes a compound semiconductor transistor device 41 which, in this particular embodiment, is a Group III-nitride based High Electron Mobility Transistor (HEMT). The electronic component 40 includes a package 42 having a ThinPak 8×8 package outline.

The package 42 includes a die pad 43 having an L-shaped form which extends on one side face 44 to provide two substantially parallel leads 45, 46 and forms a cutaway 47 in which two further leads 48, 49 are arranged. The further leads 48, 49 are spaced apart at a distance form the side face 44 of the die pad 43 and are arranged in a row adjacent the lead 46. On the opposing side 50 of die pad 43, the package 42 includes four leads 51, 52, 53, 54 which are electrically coupled by a bar 56 extending substantially parallel and spaced apart form the side face 50 of the die pad 43. The lower surfaces of the leads are 45, 46, 48, 49, 51, 52, 53, 54 arranged at two opposing sides of the electronic component 40 and provide surface mountable contact pads. The lower surface of the die pad 43 is substantially parallel with the lower surfaces of the leads and also provides a surface mountable contact pad for the electronic component 40.

The compound semiconductor transistor device 41 includes a Group III nitride-based HEMT which is a lateral transistor device. The HEMT 41 includes a source pad 57, a drain pad 58 and a gate pad 59 arranged on its upper surface 60. The source pad 57 is electrically coupled to the die pad 43 and the leads 45, 46 by a plurality of bond wires 61 extending between the source pad 57 and the upper surface 62 of the die pad 43. The drain pad 58 is electrically coupled to the bar 56 and four leads 51, 52, 53, 54 arranged on the opposing side 50 of the die pad 43 by a plurality of bond wires 63. The gate pad 59 is electrically coupled to the lead 49 arranged adjacent the side face 44 of the die pad 43 by the board wire 64. The electronic component 40 includes a source sense functionality on lead 48 which is arranged between the source leads 45, 46 and the gate lead 49.

The lead 48 is electrically coupled to source of the compound semiconductor device 41 by an additional electrical connection 66 extending between the lead 48 and source, which is separate and spaced apart from the leads 45, 46 coupled to the die pad 43 which is coupled to source.

This additional electrical connection 66 to the source of the transistor device 41 has a smaller inductance than the electrical connection provided by the bond wires 61 between the source pad 57 and the leads 45, 46. Thus the lead 48 provides the compound semiconductor device 21 with a source sense functionality which may be used by a driver chip as a reference voltage which is free from a parasitic source inductance.

The electronic component 40 also includes a housing material, such as an epoxy resin, which is indicated schematically in FIG. 3 by the dashed line 67. The housing material covers the upper surfaces of the die pad 43, the leads, the transistor device 41 and the bond wires 61, 63, 64 and 66. In this embodiment, the upper surface of the electronic component 40 is formed by the material of the housing.

FIG. 4 illustrates a cross-sectional view of an electronic component 70 according to a third embodiment. The electronic component 70 includes a HEMT 41 arranged in a package 42 having a ThinPak 8×8 package outline as in the second embodiment.

The electronic component 70, therefore, includes a die pad 43, and leads arranged adjacent two opposing sides of the die pad 43 of which a drain lead 51 and the source lead 45 which extends from the die pad 43 can be seen in the cross-sectional view of FIG. 4. The electronic component 70 also includes a HEMT 41 which is mounted on the upper surface 62 of the die pad 43. As in the embodiment illustrated in FIG. 3, the drain pad 58 is electrically coupled to the lead 51 by bond wires 63. The gate pad 59 is electrically coupled to a gate lead and a source sense functionality is provided by a bond wire 66 extending to a further lead. The gate lead and the further lead are spaced apart from the die pad 43 and cannot be seen in the cross-sectional view of FIG. 4.

The electronic component 70 differs from the electronic component 40 of the second embodiment in the form and arrangement of the electrical connection between the source pad 57 of the transistor device 41 and the die pad 43. In the electronic component 70 according to the third embodiment, the electrical connection is provided by a contact clip 71 which extends from the source pad 57 on the upper surface 60 of the HEMT 41 and the upper surface 62 of the die pad 43.

The contact clip 71 is provided by a metallic plate which is bent into an arched form having planar portions at the two distal ends. A first distal end is mounted on, and electrically coupled to, the upper surface 62 of the die pad 45 and a second distal end is mounted on, and electrically coupled to the source pad 57. In this embodiment, an uppermost portion 72 of the arch of the contact clip 71 is exposed in the upper surface 73 of the housing 67. Thus the exposed surface 72 of the contact clip 71 may be used for topside cooling. In other embodiments, the upper surface 73 of the contact clip 71 may be encapsulated by, and positioned within, the housing 67.

The connection between the drain pad 51 and bar 56 which is coupled to the leads 51, 52, 53, 54 may also be provided by a contact clip in place of the plurality of bond wires. A contact clip for the drain pad may also be embedded entirely within or partially exposed from the housing.

Figure 6:
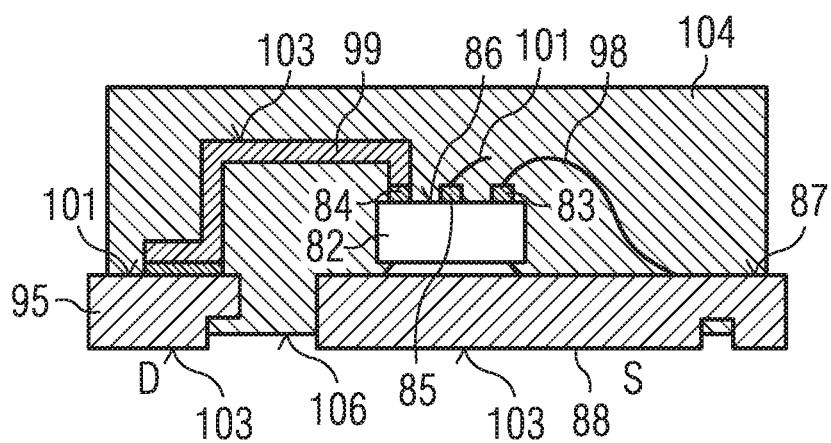
FIG. 6 illustrates a cross-sectional view of the electronic component according to the fourth embodiment.

FIG. 5 illustrates a plan view and FIG. 6 a cross-sectional view of an electronic component 80 according to a fourth embodiment. The electronic component 80 includes a package 81 which, in this embodiment, conforms to a TO leadless (TOLL) package outline and a compound semiconductor transistor device 82. In this particular embodiment, the compound semiconductor transistor device 82 is a lateral device including a source pad 83, a drain pad 84 and a gate pad 85 on its upper surface 86. The lower surface of the compound semiconductor transistor device 82 is mounted on the upper surface 87 of a die pad 88.

The die pad 88 is substantially rectangular with a cutaway region 89 in one corner. Two leads 90, 91 are arranged in this cutaway region which are spaced apart from side faces 92 of the die pad 88 forming the cutaway portion 89. The die pad 88 extends into six protruding portions 93 providing leads having a width substantially the same as the width of the leads 90, 91 which are arranged adjacent and substantially coplanar with the leads 90, 91. On the opposing side 94 of the die pad 88, the electronic component 80 includes a lead 95 having an elongate strip type shape which is spaced apart from the side face 96 of the die pad 88 and which has a length which is substantially the same as the long side of the rectangular die pad 88. The leads 90, 91, 95 and die pad 88 form part of a leadframe 97 of the electronic component 80. The leadframe 97 may include a metal such as copper. The leads 90, 91, 95 and die pad 88 may have substantially the same thickness so that the upper surfaces and lower surfaces are substantially coplanar.

The compound semiconductor transistor device 82 is mounted on the upper surface 87 of the die pad 88. The source pad 83 is electrically coupled to the die pad 88 and the leads 93 by a plurality of bond wires 98 extending between the source pad 83 and the upper surface 87 of the die pad 88. The drain pad 84 is electrically coupled to the elongate lead 95 on the opposing side 94 of the die pad 88 by a contact clip 99.

The contact clip 99 has the form of a metallic plate which is bent into an arched form having planar portions at the two distal ends. A first distal end is mounted on, and electrically coupled to, the drain pad 84 and a second distal end is mounted on, and electrically coupled to, the upper surface 100 of the elongate lead 95.

The gate pad 85 is electrically coupled to the lead 91 by a bond wire 101. The electronic component 80 has a source sense functionality which is accessible by the lead 90. The source sense lead 90 is arranged between the gate lead 91 and the protruding regions of the die pad 88 forming the source leads 93. The source sense lead (SS) 90 is electrically coupled to the source pad 83 by a bond wire 102.

The electronic component 80 also includes a plastic housing compound 104 in which the upper surface 87 of the die pad 88 and upper surfaces of the leads 90, 91, 96, the compound semiconductor transistor device 82 and the bond wires 98, 101, 102 are embedded. In a cross-sectional view of FIG. 5, it can be seen that in this particular embodiment, the contact clip 99 electrically coupling the drain pad 84 to the lead 95 is embedded within the plastic compound 104.

The lower surfaces 105 of the die pad 88, leads 90, 91, 95 and protruding portions 93 of the die pad 88 remain free of the plastic housing compound 104 and provide outer contact surfaces of the electronic component 80. The lower surfaces 105 are substantially coplanar with the lower surface 106 of the plastic housing compound 104. The plastic housing compound 104 also extends over side faces 92, 95, 106 of the die pad 88 and leads 90, 91, 96.

In some embodiments, the upper surface 103 of the contact clip 99 remains uncovered by the plastic housing composition 104 and forms a portion of the upper surface of the electronic component 80. In these embodiments, the electronic component 80 includes metallic portions on two opposing surfaces. The exposed metallic portion of contact clip may be used as an electrical connection, but may also be used to assist cooling of the compound semiconductor transistor device 82 and the electronic component 80 since heat can be more effectively dissipated from the exposed metallic portions than from the plastic housing composition 104. To assist cooling of electronic component 80, a further heatsink or cooling mechanism may be mounted on be exposed portion of the contact clip.

FIG. 7 illustrates a plan view of an electronic component 110 according to a fifth embodiment. The electronic component 110 includes a compound semiconductor device 111 and a leadframe 112 including a die pad 113 and a plurality of leads 114 arranged on two opposing sides 115, 116 of the die pad 113. Four leads 117 extend from the die pad 113 on the first side 115 and a further four leads 118 are arranged adjacent and spaced apart from the opposing side 116 of the die pad 113. Two of the four leads 118 are coupled together by a connector strip 119. Two leads 120, 121 are arranged adjacent the connector strip 119 such that the four leads 118 are arranged in a row and substantially parallel to one another.

The compound semiconductor device 111 is a transistor device which, in this embodiment, is a lateral transistor device having a source pad 122, a drain pad 123 and a gate pad 124 on its upper surface 125. The compound semiconductor device 111 is mounted on the upper surface 126 of the die pad 113.

In this embodiment, the drain pad 123 is electrically coupled to the die pad 113 by a plurality of bond wires 127. The source pad 122 is electrically coupled to the connector strip 119 by a plurality of bond wires 128 and the gate pad 124 is electrically coupled to the lead 121 by a bond wire 129. The electronic component 111 also includes a source sense function on the lead 120 which is arranged between the gate lead 121 and the connector strip 119. The source sense lead 120 is electrically coupled to source of the lateral transistor device by the bond wire 130. The source sense lead functionality is provided by a connection separate from the connection between the source pad 122 and the connector strip 119.

The die pad 113 and the leads 117, 118 include copper and have substantially the same thickness such that the upper surfaces of the die pad 113 and the leads 117, 118 are substantially coplanar and the lower surfaces of the leads 117, 118 and the die pad 113 are substantially coplanar. The electronic component 110 further includes a plastic housing composition indicated with the dashed line 131. The plastic housing composition covers the upper surfaces of the die pad 113 and leads 117, 118, the compound semiconductor device 111 and the bond wires 127, 128, 129, 130 and leaves the lower surfaces of the die pad 113 and leads 117, 118 exposed from the plastic composition. In some embodiments, the distal ends of the leads may also be exposed from the plastic housing composition in the side faces of the plastic housing composition.

In the case of a vertical transistor device such as a SiC-based transistor device, the device includes a current electrode on two opposing major surfaces. Therefore, one of the current electrodes, typically the drain, is mounted on and, electrically coupled to, the die pad by the mounting connection. An additional electrical connector such as a bond wire or a contact clip is not required for this connection. The second current electrode, typically the source, is arranged on the upper surface and is electrically coupled to a lead spaced apart from the die pad by an additional electrical connector such as one or more bond wires or a contact clip.

In case of a lateral transistor device, either one of the current electrodes, that is either the source or the drain may be electrically coupled to the die pad using an additional connector extending from the upper surface of the transistor device to the upper surface of the die pad. This additional electrical connector may be provided by one or more bond wires, a contact clip or a metallic ribbon for example. In some embodiments, the additional electrical connector is embedded within the housing of the electronic component and is electrically accessible only by the lower surface of the die pad. In other embodiments, particularly for embodiments in which the electrical connector includes a contact clip, a portion of the contact clip may be exposed from the housing and provide a surface which may be electrically coupled to an external circuit or may be coupled to an additional heat sink and used for topside cooling.

In some embodiments, both current electrodes, that is both source and drain, may be coupled to the leadframe using a contact clip. The bond wire electrically coupling the gate to the gate electrode and the bond wire providing the source of function may have smaller diameter and/or different composition than that of any bond wires used to electrically couple the current electrode to a lead or a die pad.

The electronic component according to any one of the embodiments described herein includes a compound semiconductor transistor device housed within a SMD package and includes a source sense functionality. One or more of these components may be used in a variety of applications such as a switch circuit or subcircuit of a switch circuit. Examples of switch circuits include half bridge configurations, cascode configurations or bidirectional switch. In these switch circuits, the first transistor device has a current path coupled in series with a current path of the second transistor device.

Figure 8A:
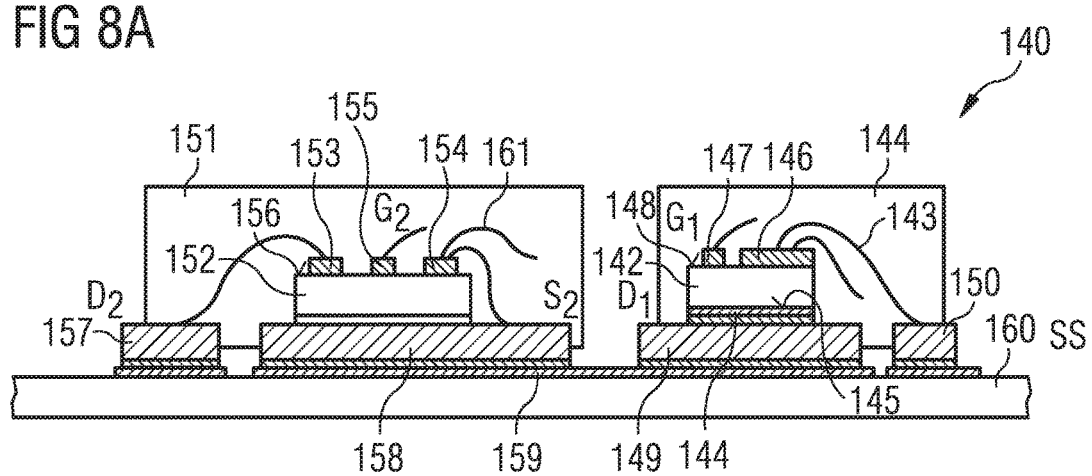
FIG. 8a illustrates a cross-sectional view of a switch circuit including a compound semiconductor device and source sense functionality.
Figure 8B:
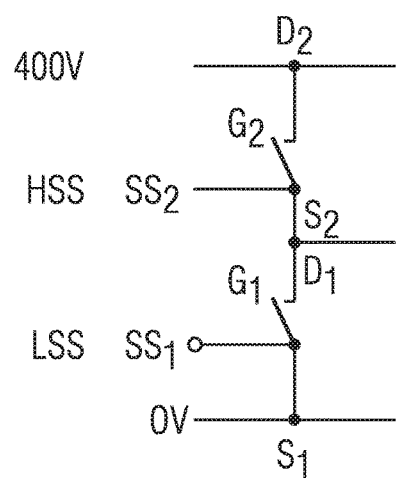
FIG. 8b illustrates a circuit diagram of a half-bridge circuit.

FIG. 8a illustrates a cross-sectional view of a switch circuit 140 including an electronic component 141 with a compound semiconductor transistor device 142 and a source sense functionality 143. A circuit diagram of the switch circuit is illustrated in FIG. 8b.

The switch circuit 140 is a half bridge circuit in which the electronic component 141 includes a silicon carbide-based transistor device 141 which forms the Low Side Switch (LSS) of the half bridge circuit. As discussed above, silicon carbide-based transistor devices are vertical transistor devices and include current electrodes on two opposing major surfaces. As is illustrated in FIG. 8a, the drain electrode 144 is arranged on the lower surface 145 and the source electrode 146 and gate electrode 147 are arranged on the upper surface 148. The drain electrode 144 is mounted on, and electrically coupled to, a die pad 149 (D1) of the electronic component 140. The gate electrode 147 and the source electrode 146 are electrically coupled to two separate leads (S1) (G1) not visible in the schematic cross-sectional view of FIG. 8a. The electronic component 141 includes a source sense functionality 143 provided by an additional electrical connection between the source 146 and a lead 150 (SS) which is separate from the source connection.

The half bridge circuit includes a second electronic component 151 providing the High Side Switch (HSS). In this embodiment, the electronic component 151 includes a compound semiconductor transistor device 152 in the form of a gallium nitride-based lateral transistor device having a drain pad 153, a source pad 154 and a gate pad 155 on the upper surface 156 of the compound semiconductor transistor device 152. The drain pad 153 is electrically coupled to a lead 157 (D2) spaced apart from a die pad 158. The source pad 154 is electrically coupled to the die pad 158 (S2) and the gate 155 is electrically coupled to lead (G2) which is not visible in the cross-sectional view FIG. 8a and which is arranged adjacent and spaced apart from the die pad 158. The half bridge circuit is formed by mounting die pad 158 of the electronic component 151 and the die pad 149 of the electronic component 141 on a common conductive trace 159 to electrically couple the drain pad 144 of the transistor device 141 to the source pad 156 of the second transistor device 151 and, therefore, the drain D1 of the Low Side Switch to the source (S2) of the High Side Switch. The conductive trace 159 may be part of a redistribution board 160.

The second transistor device 151 may also include a source sense functionality 161, but providing a second connection to the source pad 154 which is separate from the connection between the source pad 154 and the die pad 158.

In some embodiments, the Low Side Switch of the half bridge circuit may be provided by a silicon-based transistor device. In some embodiments, both of the Low Side Switch and the High Side Switch of the half bridge circuit may be provided by compound semiconductor devices and, in some embodiments, by gallium nitride-based transistor devices.

The semiconductor material of the transistor device for the low side switch may be selected depending on the duty cycle. If the duty cycle is around 50%/50% between the High Side Switch and the Low Side Switch, a gallium nitride-based transistor device may be used for the Low Side Switch. For a duty cycle of 90%/10%, a silicon-based, silicon carbide-based or gallium nitride-based transistor device may be used for the Low Side Switch. At ratios of grater than 2:1, a gallium nitride-based transistor device is typically used.

In some embodiments, a switch circuit may be provided by single electronic component.

FIG. 9 illustrates a plan view of an electronic component 170 providing a switch circuit 171 including two compound semiconductor transistor devices 172, 173. The switch circuit 171 is a half bridge circuit.

The electronic component 170 includes a leadframe 174 including a die pad 175 and a plurality of leads 176 arranged on two opposing sides of the die pad 175. The electronic component 170 includes eight contact surfaces provided by lower surfaces of the plurality of leads 176 and a contact surface provided by the lower surface of the die pad 175.

Four leads 177 178, 179 and 180 are arranged adjacent and spaced apart from a first side 181 of the die pad 175. Two leads 177, 178 are coupled together by a connector strip. The leadframe 171 includes a similar arrangement on the opposing side 182 of the die pad 175 and includes four leads 183, 184 185 186 arranged adjacent and spaced part from the side 182 of the die pad 175. Two of the leads 183, 184 are coupled together by a connector strip.

The two transistor devices 172, 173 are mounted on an upper surface 187 of the die pad 175. In this embodiment, the first transistor device 172 provides the Low Side Switch and the second semiconductor device 173 the High Side Switch of the half bridge circuit. The transistor devices 172, 173 may be Group III nitride based High Electron Mobility Transistors, for example.

The first transistor device 172 includes a source pad 188, a drain pad 189, a gate pad 190 and a source sensing pad 191 arranged on its upper surface 192. The source pad 188 is electrically coupled to the leads 177, 178 by one or more bond wires 193. The source sensing pad 191 is electrically coupled to the lead 179 by a bond wire 194 and the gate pad 190 is electrically coupled to the outermost lead 186 on first side 181 of the die pad 175 by the bond wire 195. The drain pad 189 is electrically coupled to the die pad 175 by a plurality of bond wires 196.

The second compound semiconductor transistor device 173 also includes a source pad 196, a drain pad 197, a gate pad 198 and a source sensing pad 199 on its upper surface 200. The drain pad 197 is electrically coupled to the leads 183, 184 by a plurality of bond wires 202. The gate pad 198 is electrically coupled to the outermost lead 186 by a bond wire 203 and the source pad 199 is electrically coupled to the lead 185 by bond wire 204. The source pad 196 is electrically coupled to the die pad 175 and, therefore, to the drain of the first compound semiconductor transistor device 172 by a plurality of bond wires 201.

The electronic component 170 provides a switch circuit having a half bridge configuration in which a source sense function is provided for both the first compound semiconductor transistor device 172 providing the Low Side Switch of the half bridge circuit and for the second compound semiconductor device 173 providing High Side Switch of the half bridge circuit. The electrical connection between the drain of the Low Side Switch and source of the High Side Switch is provided by the die pad 175 on which both transistor devices 172, 173 are mounted and to which the drain pad 189 of the first transistor device 172 and the source pad 196 of the second transistor device 173 are electrically coupled by their respective plurality of bond wires 196, 201.

The electrical connections are not limited to bond wires and one or more of the pluralities of bond wires may be replaced by a contact clip, for example. The electronic component 170 provides outer contact surfaces arranged substantially underneath the lead frame 171 and the housing. The position of the housing is indicated by a dashed line in FIG. 9. The electronic component 170 provides a surface mount device (SMD) including a half bridge circuit provided by two compound semiconductor transistor devices 172, 173 and a source sense function 179, 185 for both the Low Side Switch and the High Side Switch of the half bridge circuit. The node of the half bridge circuit may be electrically accessed by the contact surface provided by the lower surface of the die pad 175.

The footprint of the electronic component 170 may conform to a ThinPak 8×8 package footprint.

Figure 10A:
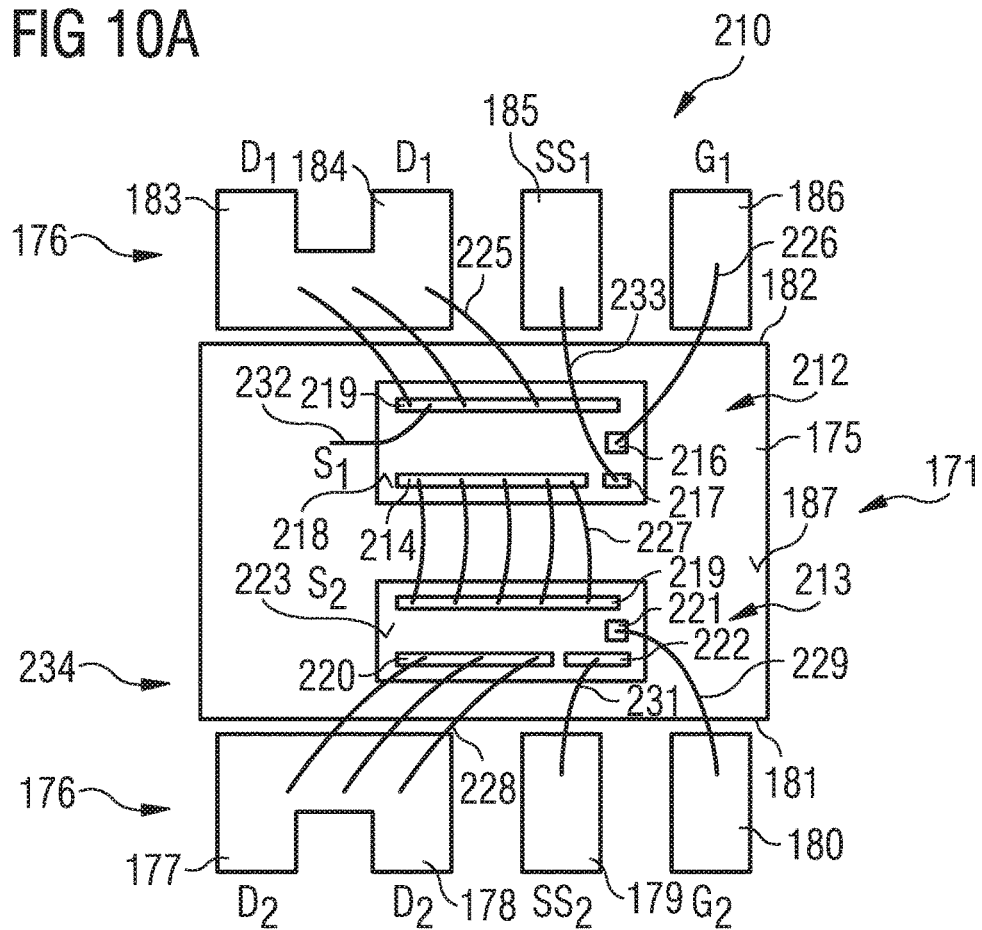
FIG. 10a illustrates a plan view of electronic component including a bidirectional switch with source sense functionality.
Figure 10B:
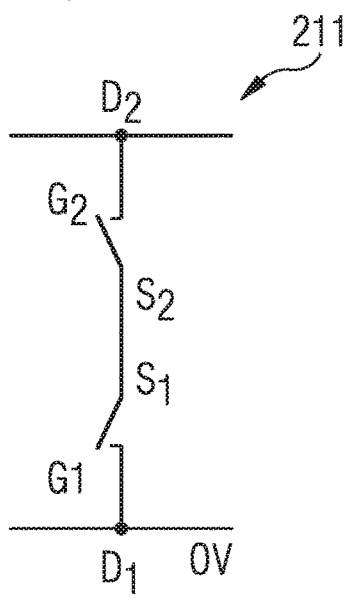
FIG. 10b illustrates a circuit diagram of a bidirectional switch with source sense functionality.

FIG. 10a illustrates a plan view of an electronic component 210 providing a bidirectional switch circuit 211 including two compound semiconductor transistor devices 212, 213 and a lead frame 171. FIG. 10b illustrates a circuit diagram of the bidirectional switch circuit 211.

The leadframe 171 has the same configuration as that illustrated in FIG. 9 and includes a die pad 175 and leads 177, 178, 179, 180 arranged adjacent and spaced apart from the first side 181 of the die pad 175 and leads 183, 184, 185, 186 arranged adjacent and spaced apart from the opposing side 182 of the die pad 175. The compound semiconductor devices 212, 213 each include a Group III nitride-based High Electron Mobility Transistor. The first compound semiconductor transistor device 212 includes a source pad 214, a drain pad 215, a gate pad 216 and a source sense pad 217 arranged on its upper surface 218. The second compound semiconductor transistor device 213 also includes a source pad 219, a drain pad 220, a gate pad 221 and a source sense pad 222 on its upper surface 223.

A bidirectional switch circuit is formed by electrically coupling the drain pad 215 of the first compound semiconductor transistor device 212 to leads 183, 184 (D1) by a plurality of bond wires 225, the gate pad 216 to lead 186 (G1) by bond wire 226, the source pad 214 (S1) of the first compound semiconductor transistor device 212 to the source pad 219 (S2) of the second compound semiconductor transistor device 213 by a plurality of bond wires 227. The drain pad 220 of the second compound semiconductor transistor device 213 is electrically coupled to leads 177, 178 (D2) by a plurality of bond wires 228 and the gate pad 221 is coupled to the lead 180 (G2) by bond wire 229. The drain pad 215 of the first compound semiconductor transistor device 212 is electrically coupled to that die pad 175 (D1) by one or more bond wires 232. The lower surfaces of the leads 177, 178, 179, 180, 183, 184, 185, 186 and die pad 175 provides contact surfaces for the electronic component 210.

A source sense functionality is provided for each of the compound semiconductor transistor devices 212, 213 of the bidirectional switch 211. The lead 185 (SS1) is electrically coupled to source of the first compound semiconductor transistor device 212 by bond wire 233. The lead 179 (SS2) is electrically coupled to source of the second compound semiconductor transistor device 213 by the bond wire 231. The source sense leads 179, 185 are arranged between the respective drain lead 183, 184; 177; 178 and gate lead 188; 186. The electronic component 210 may have a footprint 234 conforming to a ThinPak 8×8 footprint.

Figure 11:
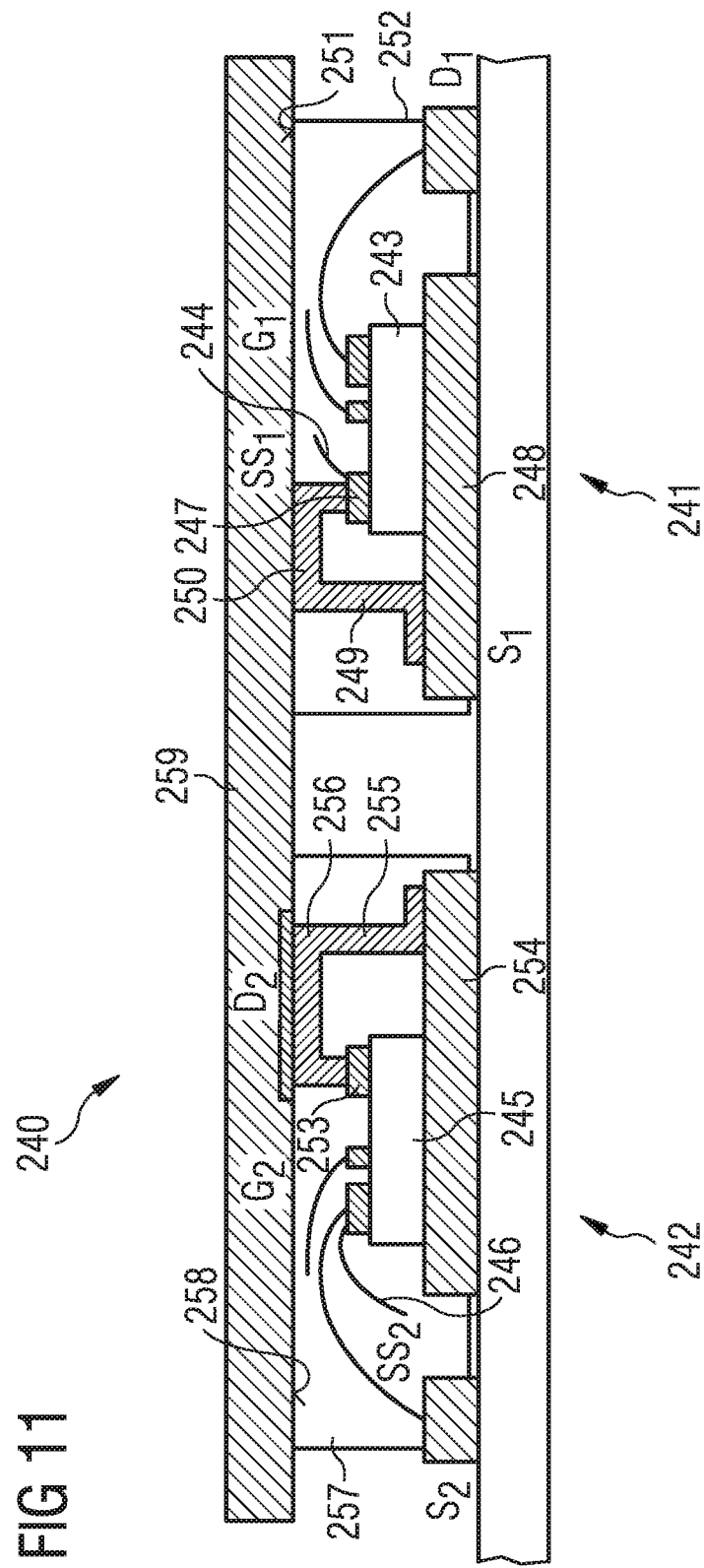
FIG. 11 illustrates a cross-sectional view of a switch circuit including two compound semiconductor transistor devices with source sense functionality and topside cooling.

FIG. 11 illustrates a cross-sectional view of a switch circuit 240 including two electronic components 241, 242 coupled to provide a half bridge circuit. The first electronic component 241 includes a compound semiconductor transistor device 243 with a source sense function 244. The first electronic component 241 provides the Low Side Switch of the half bridge circuit. The electronic component 242 also includes a second compound semiconductor transistor device 245 including a source sense function 246. The second component semiconductor device 245 provides the High Side Switch of the half bridge circuit. The switch circuit 240 includes topside cooling of both the source S1 of the first electronic component 241 providing the Low Side Switch of the half bridge circuit and the drain D2 of the second electronic component 243 providing the High Side Switch 241.

The first compound semiconductor device 243 and the second compound semiconductor device 245 are lateral transistor devices with a source pad, drain pad, gate pad on their upper surface. The first compound semiconductor device 243 and the second compound semiconductor device 245 may be gallium nitride-based High Electron Mobility devices.

The source 247 of the first compound semiconductor device 243 is electrically coupled to the die pad 248 of the electronic component 202 by contact clip 249 which has a portion 250 which is exposed in an upper surface 251 of the electronic component housing 252 of the electronic component 242. The drain 253 of the second compound semiconductor transistor device 245 providing the High Side Switch is electrically coupled to die pad 254 of the second electronic component 241 by a contact clip 255 which has a portion 256 exposed from the housing 257 in the upper surface 258 of the housing 257.

These exposed portions 250, 256 of the contact clips 249, 255, respectively, may be used to provide topside cooling of the of the half bridge circuit using a common heat dissipator 259 which may be mounted on the upper surfaces of the electronic components 241, 242 and thermally coupled to the exposed portions of the contact clips.

The half bridge circuit may be formed by electric coupling the drain D1 of the Low Side Switch to the source S2 of the High Side Switch using conductive traces of the rewiring substrate on which the electronic components 241, 242 mounted.

A compound semiconductor transistor device, such as a lateral gallium nitride-based HEMT, may be arranged in a package having a SMD outline and the package include a source sense functionality. One of the current electrodes, i.e. the source or the drain, of the lateral transistor device is coupled to the die pad and a source sense connection is provided by a second connection from the source to a lead spaced apart from the die pad which is separate from the connection providing the source node of the lateral transistor device. The transistor device may have a blocking voltage capability of at least 400V and a switching frequency capability of at least 100 kHz. The package may conform to a standard SMD package outline or footprint.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component, comprising:
   a compound semiconductor transistor device comprising a first current electrode, a second current electrode and a control electrode;
   a die pad; and
   a first lead, a second lead and a third lead,
   wherein the first lead, the second lead and the third lead are spaced at a distance from the die pad,
   wherein the control electrode is coupled to the first lead, the first current electrode is coupled to the die pad, the second current electrode is coupled to the second lead and the third lead is coupled to the compound semiconductor transistor device and provides a source sensing functionality,
   wherein the compound semiconductor transistor device is a lateral transistor device and a drain or a source of the compound semiconductor transistor device is coupled to the die pad,
   wherein the first current electrode is coupled to the die pad by a plurality of bond wires or a contact clip.

2. The electronic component of claim 1, wherein the compound semiconductor transistor device is one of a SiC transistor device, a III-V compound semiconductor transistor device and a Group III-nitride transistor device.

3. The electronic component of claim 1, wherein the compound semiconductor transistor device has a blocking voltage capability of at least 400V and a switching frequency capability of at least 100 kHz.

4. The electronic component of claim 1, further comprising a housing, wherein lower surfaces of the die pad, the first lead, the second lead and the third lead are exposed from the housing and provide substantially planar contact surfaces.

5. The electronic component of claim 1, wherein the compound semiconductor device is a vertical transistor device and a drain of the compound semiconductor transistor device is coupled to the die pad.

6. The electronic component of claim 1, wherein the second current electrode is coupled to the second lead by a plurality of bond wires or a contact clip.

7. The electronic component of claim 4, wherein the first current electrode is coupled to the die pad by a contact clip and a portion of the contact clip is exposed from the upper surface of the housing.

8. The electronic component of claim 4, wherein the second current electrode is coupled to the second lead by a contact clip and a portion of the contact clip is exposed from the upper surface of the housing.

9. The electronic component of claim 1, wherein the electronic component conforms to a TO leadless package outline or a ThinPAK8×8 package outline.

10. A switch circuit, comprising:
    a first transistor device comprising a compound semiconductor, a first current electrode, a second current electrode and a control electrode, a die pad, a first lead, a second lead, and a third lead, the first lead, the second lead and the third lead being spaced at a distance from the die pad, wherein the control electrode is coupled to the first lead, the first current electrode is coupled to the die pad, the second current electrode is coupled to the second lead and the third lead is coupled to the transistor device and provides a source sensing functionality; and
    a second transistor device,
    wherein the first transistor device has a current path coupled serially or antiserially with a current path of the second transistor device,
    wherein the first transistor device is a lateral transistor device and a drain or a source of the first transistor device is coupled to the die pad,
    wherein the first current electrode is coupled to the die pad by a plurality of bond wires or a contact clip.

11. The switch circuit of claim 10, wherein a drain of the first transistor device and a source of the second transistor device are coupled to a common die pad.

12. The switch circuit of claim 10, wherein the first transistor device is housed in a package comprising a first die pad coupled to a drain of the first transistor device and the second transistor device is housed in a package comprising a second die pad coupled to a source of the second transistor device.

13. The switch circuit of claim 12, wherein the first die pad and the second die pad are mounted on a common conductive layer.

14. The switch circuit of claim 10, wherein a first contact clip is coupled to one of a source and a drain of the first transistor device and a second contact clip is coupled to the other one of a source and a drain of the second transistor device, wherein the first contact clip and the second contact clip are at least partially uncovered.

15. The switch circuit of claim 14, wherein the first contact clip and the second contact clip are coupled to a common heat dissipation member.

16. The switch circuit of claim 10, wherein a source of the first transistor device is coupled to a source of the second transistor device.

17. An electronic component, comprising:
  a Group III nitride-based transistor device having a blocking voltage capability of at least 400V and a switching frequency capability of at least 100 kHz, a first current electrode, a second current electrode and a control electrode, wherein the control electrode is coupled to a first lead, the first current electrode is coupled to a die pad, the second current electrode is coupled to a second lead and a third lead is coupled to the Group III nitride-based transistor device and provides a source sensing functionality; and
  a housing,
  wherein the first lead, the second lead and the third lead are spaced at a distance from the die pad,
  wherein lower surfaces of the die pad, of the first lead, of the second lead and of the third lead are exposed from the housing and provide substantially planar contact surfaces,
  wherein the Group III nitride-based transistor device is a lateral transistor device and a drain or a source of the Group III nitride-based transistor device is coupled to the die pad,
  wherein the first current electrode is coupled to the die pad by a plurality of bond wires or a contact clip.

* * * * *

Disclaimer

9,899,481 B2 - Ralf Otremba, Kaufbeuren (DE); Klaus Schiess, Allensbach (DE). ELECTRONIC COMPONENT AND SWITCH CIRCUIT. Patent dated February 20, 2018. Disclaimer filed April 9, 2025, by the assignee, Infineon Technologies Austria AG.

I hereby disclaim the following complete Claim 5 of said patent.

*(Official Gazette, August 5, 2025)*